United States Patent
Aksu et al.

(10) Patent No.: US 8,404,512 B1
(45) Date of Patent: Mar. 26, 2013

(54) CRYSTALLIZATION METHODS FOR PREPARING GROUP IBIIIAVIA THIN FILM SOLAR ABSORBERS

(75) Inventors: Serdar Aksu, San Jose, CA (US); Mustafa Pinarbasi, Morgan Hill, CA (US)

(73) Assignee: SoloPower, Inc., San Jose, CA (US)

( * ) Notice: Subject to any disclaimer, the term of this patent is extended or adjusted under 35 U.S.C. 154(b) by 0 days.

(21) Appl. No.: 13/041,285

(22) Filed: Mar. 4, 2011

(51) Int. Cl.
H01L 21/00 (2006.01)

(52) U.S. Cl. ............ 438/93; 438/84; 438/95; 438/102; 438/558; 438/930

(58) Field of Classification Search .................... 438/84, 438/93, 95, 102, 542, 558, 559, 930
See application file for complete search history.

(56) References Cited

U.S. PATENT DOCUMENTS

| | | | | |
|---|---|---|---|---|
| 5,948,176 A | * | 9/1999 | Ramanathan et al. | 438/57 |
| 8,071,419 B2 | * | 12/2011 | Robinson et al. | 438/95 |
| 2008/0169025 A1 | * | 7/2008 | Basol et al. | 438/84 |
| 2010/0248419 A1 | * | 9/2010 | Woodruff et al. | 438/95 |

OTHER PUBLICATIONS

Rockett, A. et al., 'Na incorporation and diffusion in CuIn1-xGaxSe2,' Conference Record of the Twenty Fifth IEEE Photovoltaic Specialists Conference, 1996, p. 985-987.*
Hunger, R. et al., 'Removal of the surface inversion of CuInSe2 absorbers by NH3,aq etching,' Proceedings of the 3rd World Conference on Photovoltaic Energy Conversion, 2003, vol. 1, p. 566-569.*
Rockett, A., 'The electronic effects of point defects in Cu(InxGa1-x)Se2,' Thin Solid Films 361-362 (2000) p. 330-337.*
Rudmann, D. et al., 'Sodium incorporation strategies for CIGS growth at different temperatures,' Thin Solid Films 480-481 (2005) p. 55-60.*

* cited by examiner

*Primary Examiner* — Fernando L Toledo
*Assistant Examiner* — Bryan Junge
(74) *Attorney, Agent, or Firm* — Knobbe, Martens, Olson & Bear, LLP

(57) ABSTRACT

The present invention provides methods for forming a doped Group IBIIIAVIA absorber layer for a solar cell. The method includes forming precursor layers that include a dopant rich layer and then annealing the precursor layers. The annealing process results in dopants diffusing through the layers to an exterior surface. The annealing process is periodically halted to remove dopants from the exposed surface.

17 Claims, 2 Drawing Sheets

CRYSTALLIZATION METHODS FOR PREPARING GROUP IBIIIAVIA THIN FILM SOLAR ABSORBERS

BACKGROUND OF THE INVENTION

1. Field of the Invention

The present invention relates to methods and apparatus for preparing thin films of Group IBIIIAVIA compound semiconductor films, and more specifically to reacting of Group IBIIIAVIA compound semiconductor films to form photovoltaic devices.

2. Description of the Related Art

Solar cells are photovoltaic (PV) devices that convert sunlight directly into electrical energy. Solar cells can be based on crystalline silicon or thin films of various semiconductor materials that are usually deposited on low-cost substrates, such as glass, plastic, or stainless steel.

Thin film based photovoltaic cells, such as amorphous silicon, cadmium telluride, copper indium diselenide or copper indium gallium diselenide based solar cells offer improved cost advantages by employing deposition techniques widely used in the thin film industry. Group IBIIIAVIA compound photovoltaic cells, including copper indium gallium diselenide (CIGS) based solar cells, have demonstrated the greatest potential for high performance, high efficiency, and low cost thin film PV products.

As illustrated in FIG. 1, a conventional Group IBIIIAVIA compound solar cell 10 can be built on a substrate 11 that can be a sheet of glass, a sheet of metal, an insulating foil or web, or a conductive foil or web. A contact layer 12 such as a molybdenum (Mo) film is deposited on the substrate as the back electrode of the solar cell. An absorber thin film 14 including a material in the family of $Cu(In,Ga)(S,Se)_2$ is formed on the conductive Mo film. The substrate 11 and the contact layer 12 form a base layer 13. Although there are other methods, $Cu(In,Ga)(S,Se)_2$ type compound thin films are typically formed by a two-stage process where the components (components being Cu, In, Ga, Se and S) of the $Cu(In,Ga)(S,Se)_2$ material are first deposited onto the substrate or a contact layer formed on the substrate as an absorber precursor, and are then reacted with S and/or Se in a high temperature annealing process.

After the absorber film 14 is formed, a transparent layer 15, for example, a CdS film, a ZnO film or a CdS/ZnO film-stack, is formed on the absorber film 14. Light enters the solar cell 10 through the transparent layer 15 in the direction of the arrows 16. The preferred electrical type of the absorber film is p-type, and the preferred electrical type of the transparent layer is n-type. However, an n-type absorber and a p-type window layer can also be formed. The above described conventional device structure is called a substrate-type structure. In the substrate-type structure light enters the device from the transparent layer side as shown in FIG. 1. A so called superstrate-type structure can also be formed by depositing a transparent conductive layer on a transparent superstrate, such as glass or transparent polymeric foil, and then depositing the $Cu(In,Ga)(S,Se)_2$ absorber film, and finally forming an ohmic contact to the device by a conductive layer. In the superstrate-type structure light enters the device from the transparent superstrate side.

Contrary to CIGS and amorphous silicon cells, which are fabricated on conductive substrates such as aluminum or stainless steel foils, standard silicon solar cells are not deposited or formed on a protective sheet. Such solar cells are separately manufactured, and the manufactured solar cells are electrically interconnected by a stringing or shingling process to form solar cell circuits. In the stringing or shingling process, the (+) terminal of one cell is typically electrically connected to the (−) terminal of the adjacent solar cell. Circuits may then be packaged in protective packages to form modules. Each module typically includes a plurality of strings of solar cells which are electrically connected to one another.

In a thin film solar cell employing a Group IBIIIAVIA compound absorber, the cell efficiency is a strong function of the molar ratio of IB/IIIA. If there are more than one Group IIIA materials in the composition, the relative amounts or molar ratios of these IIIA elements also affect the properties. For a $Cu(In,Ga)(S,Se)_2$ absorber layer, for example, the efficiency of the device is a function of the molar ratio of Cu/(In+Ga). Furthermore, some of the important parameters of the cell, such as its open circuit voltage, short circuit current and fill factor, vary with the molar ratio of the IIIA elements, i.e. the $Ga/(Ga^+ In)$ molar ratio. In general, for good device performance the Cu/(In+Ga) molar ratio is kept at around or below 1.0. On the other hand, as the $Ga/(Ga^+ In)$ molar ratio increases, the optical bandgap of the absorber layer increases and therefore the open circuit voltage of the solar cell increases while the short circuit current typically may decrease. It is important for a thin film deposition process to have the capability of controlling both the molar ratio of IB/IIIA, and the molar ratios of the Group IIIA components in the composition.

Two-step deposition techniques, involving deposition of a series of films to form a precursor film stack and then reaction of the precursor film stack to form the compound absorber are often used to fabricate CIGS layers. Individual thicknesses of the films that form the stacked precursor film layer must be well controlled because their thicknesses influence the final stoichiometry or composition of the compound layer after the reaction step. It is known that the structural and electrical properties of CIGS layers are affected when doped with Group IA alkali metals such as sodium (Na), potassium (K) and lithium (Li). Especially, incorporation of very small amounts of Na into CIGS layers has been shown to be beneficial for increasing the conversion efficiencies of solar cells fabricated using such layers. Doping CIGS layers with Na can be achieved by various ways.

One popular method involves Na diffusion from glass substrates. Na diffuses into the CIGS layer from the substrate if the CIGS layer is grown on a Mo-contact layer deposited on a Na-containing soda-lime glass substrate. This is, however, an uncontrolled process and can cause non-uniformities in the CIGS layers depending on how much Na diffuses from the substrate through the Mo-contact layer.

Other popular dopant incorporation methods include forming a CIGS precursor including a thin Na-containing layer, such as a NaF layer, so as to allow Na from the Na-containing layer to diffuse into the growing CIGS absorber during the reaction of CIGS precursor to thereby dope the CIGS layer. However when such Na-containing layers are used for CIGS doping, both the small amounts used, often not more than 2 atomic percent, and the high diffusivity of Na at CIGS reaction temperatures make controlled doping CIGS with Na a challenging process. Accordingly, controlling the Na-containing layer thickness is critical for this doping technique. Studies have shown that if the amount of Na-dopant introduced through the Na-containing layer is inadequate, poor conversion efficiencies are observed in such inadequately doped solar cells. However, if the amount of Na dopant is excessive, some properties of Group IBIIIAVIA compound layers, such as their crystalline properties, mechanical properties and especially their adhesion to their substrate, deteriorate.

As aforementioned, controlled doping of Group IBIIIA-VIA compound layers with alkali metals improve their quality in terms of yielding higher efficiency solar cell devices. Considering the shortcomings of presently available doping methods, it is highly desirable to develop new methods of introducing and controlling alkali metals in Group IBIIIA-VIA layers.

SUMMARY OF THE INVENTION

The present invention provides methods for forming Group IBIIAVIA thin films by reacting Group IBIIIAVIA precursors including dopant materials.

In one aspect, the invention includes continuously electroplating a film onto a conductive surface using an electroplating unit as the roll-to-roll sheet moves therethrough.

In another aspect, the invention comprises a method of forming a doped Group IBIIIAVIA absorber layer on a base. This method comprising depositing a precursor layer on the base, the precursor layer comprising a Group IB material film including Cu, a Group IIIA material film including at least one of In and Ga, a Group VIA material film including Se and a dopant material film that includes at least one of Na, K and Li. This method further comprises partially reacting the precursor layer at a first temperature range form a doped semi absorber layer, wherein the step of partially reacting the precursor layer causes at least some of the dopant material to diffuse to at least a top surface of the doped semi absorber layer and form a dopant material rich film thereon. This method further comprises applying a surface treatment to remove at least some of the dopant material rich film from the top surface of the doped semi-absorber layer; and reacting the doped semi-absorber layer, after removing the at least some of the dopant material rich film, at a second temperature range to form a doped Group IBIIIAVIA absorber layer.

In another aspect this invention comprises a method of forming a doped Group IBIIIAVIA absorber layer for a solar cell on a base. In this aspect, the method comprises depositing a precursor layer on the base, the precursor layer comprising a Group IB material film, a Group IIIA material film, a Group VIA material film and a dopant material film. In this aspect, the method further comprises annealing the precursor layer on the base to form the doped Group IBIIIAVIA absorber layer wherein the annealing of the precursor layer induces diffusion of the dopant to an exposed surface of the absorber layer. In this aspect, the method further comprises interrupting the annealing of the precursor layer to remove at least some of the dopant from the exposed surface of the absorber layer; and annealing the precursor layer to continue to form the doped Group IBIIIAVIA absorber following removal of at least some of the dopant from the exposed surface.

These and other objects and advantages of the present invention will be more apparent from the following description taken in conjunction with the accompanying drawings.

DETAILED DESCRIPTION OF THE PREFERRED EMBODIMENT

Figure 1:
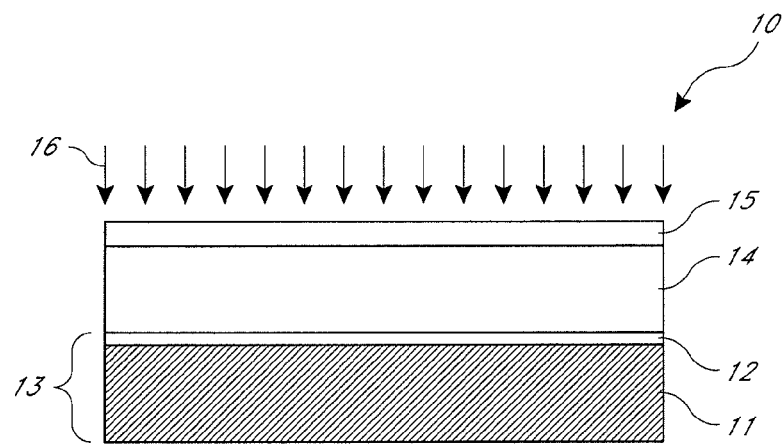
FIG. 1 is a schematic side view of a thin film solar cell including a Group IBIIIAIVA compound absorber layer.

Various embodiments of the present invention provide methods to form doped Group IBIIIAVIA semiconductor films or layers on continuous flexible substrates or bases, which may be used in the formation of solar cells or photovoltaic cells.

In one embodiment, the crystallization step or reaction step that forms a doped CIGS absorber is carried out using thermal annealing techniques at high temperatures. A CIGS precursor including for example Group IA dopant elements is annealed at high temperatures to form the doped CIGS layer. At CIGS absorber reaction temperatures, a portion of the Group IA elements such as Na, K or Li may not be used for doping and may be expelled from the CIGS absorber matrix, resulting in these elements accumulating at the CIGS absorber surface as a dopant rich film at the end of the reaction process.

This dopant rich film at the absorber surface may deteriorate not only the properties of the absorber layer and its surface but also the properties of the layers that are subsequently deposited on the absorber layer. It has been observed that after the doped CIGS absorber layer is formed, attempts to clean this dopant segregation on the absorber may form defects at the absorber surface. Defects at surface and resulting changes in surface characteristics on this critical surface may in turn significantly affect the conversion efficiencies of the final photovoltaic device. For example, the surface of the CIGS absorber layer may be a part of a heterojunction established between the CIGS absorber top surface and a bottom surface of a buffer layer, such as a CdS layer, formed on the CIGS absorber layer. Any defects or irregularities at this junction or interface will strongly affect the carrier transfer through this junction.

As will be described more fully below, in one embodiment, the accumulated dopant on the absorber surface is removed by cleaning the absorber surface with a water-containing liquid, such as an aqueous cleaning solution or a cleaning solution which uses mixed solvents of DI water and an organic liquid solution. The cleaning solution is used to wash off the excess dopant from the surface before the absorber reaction process is completed. In another embodiment, a doped CIGS absorber layer preparation may be performed using two or more reaction steps and the excess dopant is washed off or otherwise removed from the surface between reaction steps. Alternatively, embodiments of this invention can also be used to control the dopant dosing of the absorber by washing off or otherwise removing the excess dopant between the multiple reaction steps.

In one process sequence, a doped Group IBIIIAVIA or CIGS absorber layer may be formed on a base by first depositing a Group IBIIIAVIA precursor layer on the base. The Group IBIIIAVIA precursor layer comprises in one embodiment a Group IB material film such as Cu, Group IIIA material films such as In and Ga, a Group VIA material film including Se and a dopant material film that includes at least one of Na, K and Li. At a first reaction step, the Group IBIIIAVIA precursor layer is partially reacted in a reactor to form a semi reacted Group IBIIIAVIA absorber layer. The semi reacted Group IBIIIAVIA absorber layer includes a bottom surface adjacent to the base and an upper surface. Under the conditions of the first reaction, the dopant material from the dopant material film is distributed within the semi reacted Group IBIIIAVIA absorber layer while some of the dopant material diffuses towards the upper surface and forms a dopant rich top film (segregation film) on the upper surface of the semi reacted Group IBIIIAVIA absorber layer. In the following step, the dopant material rich film is removed from the upper surface of the semi reacted Group IBIIIAVIA absorber layer. After the removal of the dopant material rich film, the semi reacted Group IBIIIAVIA layer is reacted at a second temperature range to form a doped Group IBIIIAVIA absorber layer. Once the doped Group IBIIIAVIA absorber layer is formed, the process may continue by forming the other components of the photovoltaic device, such as the buffer, transparent oxide layers and top conductive grids, and others.

Figure 2A:
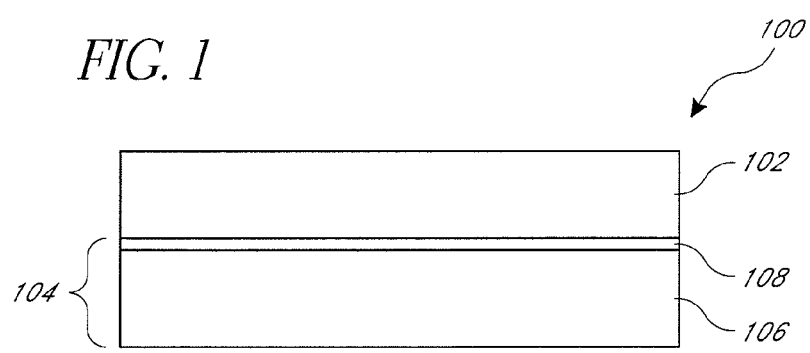
FIG. 2A is a schematic side view a CIGS absorber precursor formed on a base.
Figure 2B:
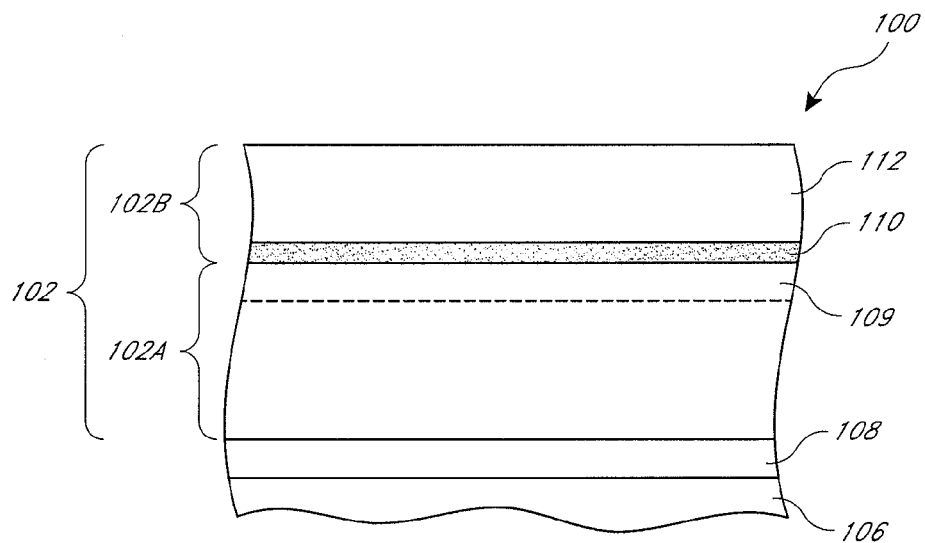
FIG. 2B is a schematic detail view of the CIGS absorber precursor shown in FIG. 2A.

In the following section, an exemplary embodiment of a process of the invention will be described with FIGS. 2A-4. FIGS. 2A-2B show components of an exemplary structure 100 before a thermal process that forms a solar cell absorber of at least one embodiment of the present invention. Accordingly, the structure 100 includes an absorber precursor 102 or precursor layer formed over a base 104. The base 104 may include a substrate 106, which may be conductive substrate and a conductive contact layer 108 or contact layer formed on the substrate 106. The substrate 106 may be a metallic foil such as a stainless steel foil or an aluminum foil substrate. The contact layer 108 may include at least one contact film such as molybdenum (Mo) contact film, and optional diffusion barrier films (not shown) to prevent material diffusion between the absorber precursor 102 and the substrate 106. In this embodiment, the precursor layer 102 may be made of a stack of a plurality of films of Group IB such as Cu and Group IIIA materials such as In and Ga as well as optionally Group VIA materials such as Se and S. These elements might be incorporated into the stack either in the form of pure elemental films of Cu, In, Ga and Se, or thin films of binary alloys and mixtures (Cu—Ga, Cu—In, Ga—Se, In—Se, etc.), or thin films of ternary alloys and mixtures (Cu—In—Ga, Cu—In—Se, Cu—Ga—Se, etc.), or thin films of ternary alloys and mixtures (Cu—In—Ga—Se). In this respect, as shown in a detail view in FIG. 2B, the precursor layer 102 may include a primary stack 102A formed on the base 104 and a secondary stack 102B that is formed on the primary stack 102A.

The primary stack 102A may include films of a Group IB material, such as Cu, and Group IIIA materials, such as In and Ga, and a Group VIA material such as Se or optionally Te. A top film 109 of the primary stack 102A may include any of Cu, In, Ga and Se. In one embodiment, the top film 109 is a Se-containing film in the form of either pure Se or indium selenide, gallium selenide or copper selenide. Cu, In, Ga and Se films of the primary stack 102A may be deposited using electrodeposition techniques. Alternatively Se-containing layer may be deposited using evaporation technique. Alternatively, the primary stack may include a Cu—In—Ga ternary alloy film and the top film 109 including a Se-film.

In one implementation, a roll-to-roll electrodeposition system including one or more electrodeposition units may form the primary precursor stack 102A on a surface of a continuous flexible base or workpiece with substantial thickness control and uniformity. The continuous flexible base including a continuous conductive substrate having a continuous contact layer is supplied from a supply roll, advanced through each electrodeposition unit as well as other units and taken up and wound as a receiving roll with the desired primary precursor stack structure. The number and order of the electrodeposition units may be changed to deposit various primary precursor stacks structures comprising Cu, In, Ga and optionally Se films from electrolytes containing these elements on the continuous flexible base. For example, if there are Cu, In and Ga electrodeposition units in the roll-to-roll system, a Cu/In/Ga precursor stack can be formed on the continuous flexible base by advancing it through the electrodeposition units. With multiple runs including selected deposition sequences, the number of deposited films can be increased. Changing the order of electrodeposition units and optionally adding other electrodeposition units such as a Se electrodeposition unit, one may obtain exemplary stacks such as Cu/Ga/In, In/Cu/Ga, Ga/Cu/In, Cu/Ga/Cu/In, Cu/Ga/Cu/In/Cu, Cu/In/Cu/Ga, Cu/In/Cu/Ga/Cu, Cu/In/Ga/Se, In/Cu/Ga/Se, Ga/Cu/In/Se, Cu/Ga/Cu/In/Se, Cu/Ga/Cu/In/Cu/Se, Cu/In/Cu/Ga/Se, Cu/In/Cu/Ga/Cu/Se or other possible stack orders. In addition to elemental films, binary or ternary alloy thin films can be also used in the precursor stack formation. For example, the first film of the precursor stack may be formed by sequentially depositing a (Cu—In—Ga) ternary alloy film, a (Cu—In) binary alloy film, a (Cu—Ga) binary alloy film and a (Cu—Se) binary alloy film. If the last Cu—Se film is not able to provide all the selenium needed, a pure Se film may be deposited as the top film of the stack.

The secondary stack 102B may include a dopant containing film 110 or dopant film deposited on the primary stack 102A and on the top film 109 of the primary stack 102A, and a capping layer 112 is then deposited over the dopant film 110. The dopant film 110 includes at least one of Na, Li and K materials. In one embodiment, the dopant film 110 is a Na containing film, such as a NaF film, to dope the resulting Cu (In, Ga) $Se_2$ absorber layer (CIGS layer). Other exemplary materials for the dopant film may include NaCl, $Na_2S$ and $Na_2Se$. The capping layer 112 may include at least a Group VIA material such as Se. The capping layer 112 may be made of pure Se.

The thickness of the dopant containing film 110 may be in the range of 5-100 nm depending on the total thickness of the precursor stack. It is desirable to have the dopant amount to be 0.01-1 atomic percent in the final CIGS(S) layer. The dopant containing film 110 may be deposited using various techniques such as evaporation, sputtering and wet deposition processes. Wet deposition approaches include spraying of a dopant containing solution, such as an alcohol or water solution of NaF, onto the primary precursor stack 102A, dipping it into a dopant containing solution, or printing or doctor blading a dopant containing solution onto the primary precursor stack 102A, followed by drying. The capping layer including Se may be deposited using an evaporation technique.

Figure 3A:
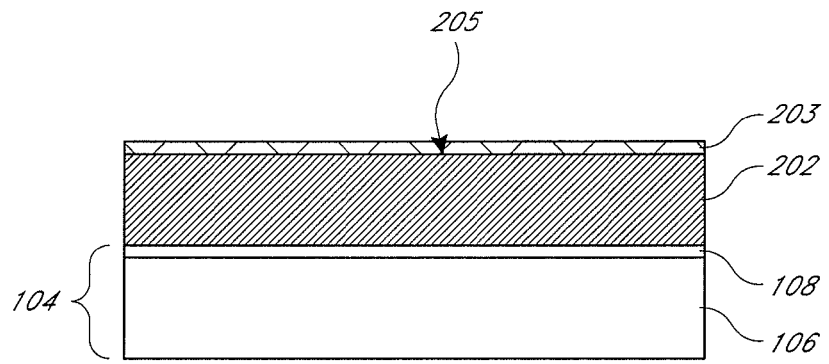
FIG. 3A is a schematic side view of a semi-reacted CIGS absorber layer including a dopant rich segregation layer positioned thereon, wherein the semi-reacted CIGS absorber layer has been formed by annealing the CIGS absorber precursor shown in FIGS. 2A-2B.
Figure 3B:
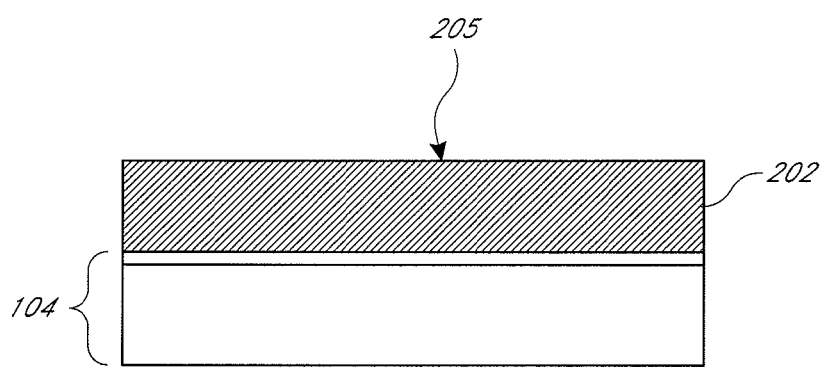
FIG. 3B is a schematic side view of the semi-reacted CIGS absorber layer shown in FIG. 3A after the dopant rich segregation layer is removed from the semi reacted CIGS absorber layer.
Figure 4:
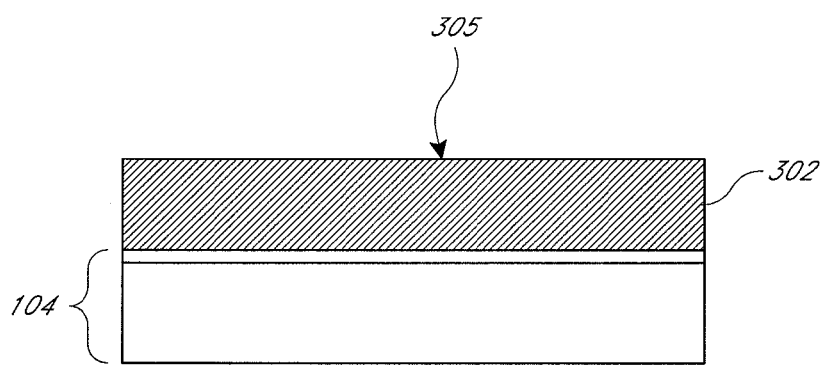
FIG. 4 is a schematic side view of a fully reacted CIGS layer formed by annealing the semi-reacted CIGS absorber layer shown in FIG. 3B.

Once the structure 100 is completed by forming the precursor layer 102 over the base 104 as described above at least a two step annealing process is employed to form a doped absorber layer as shown in FIGS. 3A and 4. In a first annealing step, the structure 100 is annealed at a first reaction temperature in the range of 400-600° C. for about 1 to 60 minutes to partially react the precursor layer 102 to form a semi reacted CIGS absorber layer 202 shown in FIG. 3A. During this step, as the CIGS crystals are forming, a dopant rich layer 203 is formed on a top surface 205 of the semi reacted CIGS absorber layer 202 by the dopant atoms (Na in this embodiment) diffusing towards and accumulating at the top surface 205. As shown in FIG. 3B, a surface treatment step following the partial reaction is applied to remove the dopant rich layer 203 from the top surface 205. During the surface treatment step, the surface 205 is cleaned by applying a fluid to the surface to remove the dopant rich layer 203. An exemplary fluid may be a cleaning solution, such as an aqueous cleaning solution, which removes some or all of the dopant rich layer with little damage to the surface 205 of the semi reacted CIGS absorber layer 202. Cleaning solution formulations in some embodiments are designed to remove not only the accumulated dopant rich film on the top surface 205 but also any unwanted surface oxides, such as copper oxides, gallium oxides and indium oxides, that may form on the top surface 205 of the semi reacted absorber layer 202 with the dopant rich film.

The desired anneal time of the first anneal process is determined by the reaction kinetics of the particular precursor layer at the particular anneal temperature, ramp rate etc. The anneal time in the first step might be established by characterization of partially reacted CIGS layer by X-ray diffraction methods to determine if the desired phase formation has been achieved.

As shown in FIG. 4, following the surface treatment step, in a second annealing step, the semi-reacted CIGS absorber layer 202 is fully reacted and converted to a doped CIGS layer 302 with a top surface 305 that has less or even no dopant material residues. In the second annealing step, a second reaction temperature in the range of 400-600° C. for about 1 to 60 minutes is applied to fully react the semi reacted CIGS absorber layer 202 to form the doped CIGS absorber layer 302 over the base 104. The semi reacted CIGS absorber layer 202 may have less than 20%, preferably less than 10% metallic phase after the first annealing step while the doped CIGS layer 302 includes very little or no metallic phase in it. A second surface treatment step may also be carried out to remove any of possible dopant accumulation after the second annealing step. After the second annealing or the second surface treatment step, the process may continue to build a CdS buffer layer and TCO layers, and other layers to form a solar cell.

After the surface treatment step following the first annealing step, a surface detection step is applied to qualitatively detect Na on the top surface 205 (FIG. 2A). The detection process, such as an Energy Dispersive Spectrometry (EDS), may be performed in-situ or on the samples from the same roll or the batch to determine any remaining Na on the surface. When no sodium is detected on the surface, the process may continue with the next anneal step. Although EDS is good for qualitatively detecting Na on the CIGS surface, quantification might be difficult with this method. A secondary ion mass spectroscopy (SIMS) with depth profiling may be used for quantification. The SIMS is used to determine the density distribution of Na (atoms per $cm^3$) throughout the CIGS film. A good metric to use for detection of excess sodium on the surface is a Na concentration exceeding $1\times10^{20}$ atoms/$cm^3$, which is approximately equal to 1 atomic percent of the CIGS film. If Na amount is more than $1\times10^{20}$ atoms/$cm^3$ within the first 300 Å of CIGS absorber it might be necessary to conduct a surface treatment step. In this respect, the detection step may also be applied before the surface treatment step to detect the existence and/or the amount of Na.

In the absorber precursor 102, the reaction of the Group IB and IIIA metals with the Group VIA material(s) may be achieved by several different methods during a two step annealing process described above. The absorber precursor 102 may be heated up in a furnace, in an RTP (Rapid Thermal Processing) unit or laser annealing unit, or the like, to facilitate the chemical reaction between the Group TB and MA metals and Group VIA materials. In another method, the absorber precursor 102 can be exposed to heat and additional Group VIA material such as vapors of Se, Te and S or gases containing Group VIA elements such as hydrogen selenide, hydrogen telluride and hydrogen sulfide.

The phase composition of the semi reacted CIGS absorber layer 202 may vary depending on the temperature and the duration of the applied first anneal step. The reaction may be carried out in the presence of excess Group VIA materials to minimize any unreacted metallic phases such as Cu, In, Ga, Cu—In alloys, Cu—Ga alloys, Ga—In alloys and Cu—In—Ga alloys. If Se is the only Group VIA element involved in the reaction process, the major phases in the semi reacted CIGS absorber layer 202 may be binary selenides such as Cu-selenide, In-selenide, Ga-selenide and ternary compounds such as InGa-selenide, CuIn-selenide, CuGa-selenide. Formation of indium selenide phases is kinetically favored compared to gallium selenide phases, which leads to the formation of copper indium selenide phases before the formation of copper gallium selenide phases. The amount of quaternary selenide CuInGa-selenide is not expected to be too high in the semi reacted CIGS absorber layer 202 because this compound is believed to be forming as a result of a slow reaction between the CuIn-selenide, and CuGa-selenide ternary phases. In the second anneal step, while the doped CIGS absorber layer 302 is formed as a high quality quaternary CuInGa-selenide phase, the remaining binary phases are substantially eliminated and the amount of the ternary phases are reduced through the reaction of CuIn-selenide and CuGa-selenide phases.

During the surface treatment step, as mentioned above, DI water-based aqueous solutions may be used to remove some or all of a dopant rich layer 203. In one embodiment, the aqueous cleaning solution may include pure DI water. However, the DI water may include other chemicals to improve the efficiency of cleaning action. The pH of the cleaning solution may preferably be either in the acidic regime between 1 and 4, or alkaline regime between 8 and 13, preferably 9 to 12.5. The cleaning solution may preferably not include a neutral pH between 4 and 8. The pH of the solution in the acidic regime can be adjusted by incorporation of acids such as sulfuric acid, hydrochloric acid and phosphoric acid. Complexing agents such as tartaric acid, citric acid, acetic acid, malonic acid, malic acid, succinic acid, ethylenediamine, ethylenediaminetetraacetic acid, nitrilotriacetic acid, and hydroxyethylethylenediaminetriacetic acid, and the like may be added to the cleaning solution to improve the cleaning action of dopant rich portions left on the absorber surface. In addition to complexing agents, some organic ingredients such as surfactants may be included to reduce surface tension and minimize corrosion and pitting of molybdenum layer or stainless steel substrate. Major part of these organic ingredients might be in the form of alcohols (up to 30% of the total electrolyte volume), either in the form of simple alcohols such as ethanol, methanol and isopropyl alcohol or as multihdydric alcohols, such as glycerol, which are believed to be helpful in reducing or minimizing the pitting and corrosion issues. In order to further inhibit corrosion behavior triazole-based inhibitors such as benzotriazole may also be added in the cleaning solutions.

Other additives for the cleaning solutions of the present invention include surfactants in the form of anionic, cationic, zwitterionic (amphoteric), or non-anionic surfactants of mixtures of these. Anionic surfactants might be based on permanent anions (sulfate, sulfonate, phosphate) or pH-dependent anions (carboxylate). An anionic surfactant or a mixture of anionic surfactants for the cleaning solutions of some of the embodiments of the present invention can be selected from sulfate-based anionic surfactants such as alkyl sulfates (ammonium lauryl sulfate, sodium lauryl sulfate) and alkyl ether sulfates (sodium laureth sulfate and sodium myreth sulfate), or sulfonate-based surfactants such as docusates (dioctyl sodium sulfosuccinate), sulfonate fluorosurfactants (perfluorooctanesulfonate, perfluorobutanesulfonate) and alkyl benzene sulfonates, or phosphate-based surfactants such as alkyl aryl ether phosphate, alkyl ether phosphate, or carboxylate-based surfactants such as alkyl carboxylates (fatty acid salts (soaps), sodium stearate), sodium lauroyl sarcosinate, carboxylate fluorosurfactants (perfluorononanoate, perfluorooctanoate). A cationic surfactant or a mixture of cationic surfactants for the cleaning solutions of the present invention can be selected from surfactants such as pH-dependent primary, secondary or tertiary amines. In this case, it is important to note that primary amines become positively charged at pH<10, secondary amines become charged at pH<4. An example chemical may be octenidine dihydrochloride. Cationic surfactants may also be selected from permanently charged quaternary ammonium cations such as alkyltrimethylammonium salts, cetyl trimethylammonium bromide, hexadecyl trimethyl ammonium bromide, cetyl trimethylammonium chloride, cetylpyridinium chloride, polyethoxylated tallow amine, benzalkonium chloride, benzethonium chloride, 5-Bromo-5-nitro-1,3-dioxane, dimethyldioctadecylammonium chloride, dioctadecyldimethylammonium bromide. A zwitterionic surfactant or a mixture of zwitterionic surfactants for the cleaning solutions of the present invention can be selected from surfactants based on primary, secondary or tertiary amines or quaternary ammonium cation with sulfonate (e.g. 3-[(3-Cholamidopropyl)dimethylammonio]-1-propanesulfonate), sultaines (e.g. cocamidopropyl hydroxysultaine), carboxylates (e.g. amino acids, amino acids, betaines including cocamidopropyl betaine and phosphates (e.g. Lecithin). A nonionic surfactant or a mixture of nonionic surfactants for the cleaning solutions of the present invention can be selected from surfactants as fatty alcohols (e.g., cetyl alcohol, stearyl alcohol, cetostearyl alcohol, oleyl alcohol), polyoxyethylene glycol alkyl ethers (e.g. octaethylene glycol monododecyl ether and pentaethylene glycol monododecyl ether), polyoxypropylene glycol alkyl ethers, glucoside alkyl ethers (e.g. decyl glucoside, lauryl glucoside, octyl glucoside), polyoxyethylene glycol octylphenol ethers (e.g.), polyoxyethylene glycol alkylphenol ethers (e.g. nonoxynol-9), glycerol alkyl esters (e.g glyceryl laurate), polyoxyethylene glycol sorbitan alkyl esters (e.g. polysorbates), sorbitan alkyl esters (e.g. spans), dodecyldimethylamine oxide, or block copolymers of polyethylene glycol and polypropylene glycol (eg. poloxamers).

The pH of the cleaning solution in the alkaline regime given above may be adjusted by addition of sodium hydroxide, potassium hydroxide or ammonium hydroxide. Alkaline buffer couples could be also employed to adjust the pH. Suitable alkaline pH buffer systems include monopotassium phosphate/dipotassium phosphate, boric acid/sodium hydroxide, sodium bicarbonate/sodium carbonate, monosodium tellurate/disodium tellurate, monosodium ascorbate/disodium ascorbate, and dipotassium phosphate/tripotassium phosphate.

The process described above mainly includes a two-step reaction with one or more surface treatment or cleaning steps. In other embodiments, multiple cleaning and reaction steps may be carried out. For example, in a three step process, first a Group IBIIIAVIA precursor layer is formed as described above. In a first annealing step, this precursor is annealed at a first reaction temperature in the temperature range of 400-600° C. for about 1 to 60 minutes to partially react the precursor layer in a first partial reaction step. Then, a first surface treatment step using the cleaning solution is conducted to remove the Group IA dopant rich layers on the surface. The first surface treatment step is followed by a second annealing step at a second reaction temperature in the temperature range of 400-600° C. for about 1 to 60 minutes to further facilitate reaction in a second partial reaction step to form the semi-reacted CIGS absorber. A second surface treatment step using the cleaning solution is then conducted after the second anneal step. In a third annealing step, a third reaction temperature in the range of 400-600° C. for about 1 to 60 minutes is applied to more fully react the semi reacted CIGS absorber. A third cleaning step may be carried out to remove at least some of and perhaps all of the dopant rich layers or residues resulting from the third reaction step. In each surface treatment step, the same or different cleaning solutions may be used. In addition, two or more subsequent surface treatment steps might be employed following a reaction step in the processes of absorber formation. For example, a surface treatment step using a liquid solution with an alkaline chemistry might first be applied. Then, the surface might be cleaned with DI water. This might follow a surface treatment step using a liquid solution with acidic chemistry. The surface might be cleaned finally with pure DI water. When continuous substrates such as metal foils are used as the base for CIGS layer, the surface treatment processes can be carried out in a roll-to-roll or reel-to-reel fashion. In such cleaning tools, partially reacted absorber on the flexible web on a spool may be fed through the surface treatment chamber, passing through multiple surface treatment modules with different treatment chemistries and then and then wound on a second spool.

Although the present invention is described with respect to certain embodiments described above, modifications changes and alteration thereto will be apparent to those skilled in the art. Hence, the scope of the present invention should not be limited to the foregoing description, but should be defined by the appended claims.

What is claimed is:
1. A method of forming a doped Group IBIIIAVIA absorber layer on a base, the method comprising:
depositing a precursor layer on the base, the precursor layer comprising a Group IB material film including Cu, a Group IIIA material film including at least one of In and Ga, a Group VIA material film including Se and a dopant material film that includes at least one of Na, K and Li;
partially reacting the precursor layer at a first temperature range to form a doped semi absorber layer, wherein the step of partially reacting the precursor layer causes at least some of the dopant material to diffuse to at least a top surface of the doped semi absorber layer and form a dopant material rich film theron;
applying a surface treatment to remove at least some of the dopant material rich film from the top surface of the doped semi-absorber layer, the surface treatment including applying a liquid including water to the top surface to remove the dopant material rich film, wherein the liquid has a pH of 1 to 4; and
reacting the doped semi-absorber layer, after removing the at least some of the dopant material rich film, at a second temperature range to form a doped Group IBIIIAVIA absorber layer.
2. The method of claim 1, wherein the step of depositing the precursor layer comprises the steps of:
depositing a metallic stack including at least one Cu film, In film and Ga film;

depositing the dopant material film over the metallic stack; and depositing a first Se film on the dopant material film.

3. The method of claim 1, wherein the step of depositing the precursor layer further comprises the step of depositing a second Se film on the metallic stack prior to depositing the dopant material film.

4. The method claim of 1, wherein the liquid comprise complexing agents selected from tartaric acid, citric acid, acetic acid, malonic acid, malic acid, succinic acid, ethylenediamine, ethylenediaminetetraacetic acid, nitrilotriacetic acid, and hydroxyethylethylenediaminetriacetic acid.

5. The method of claim 1, wherein the liquid further comprise organic ingredients selected from ethanol, methanol and isopropyl alcohol.

6. The method of claim 1, wherein the liquid further comprise surfactants in the form of anionic, cationic, zwitterionic and non-anionic surfactants of mixtures of these.

7. The method of claim 1, wherein the step of applying the surface treatment includes applying water to the top surface to remove the dopant material rich film.

8. The method of claim 1, wherein the step of partially reacting is performed at the first temperature range of 250-450° C.

9. The method of claim 1, wherein the step of partially reacting is performed at the second temperature range of 250-550° C.

10. The method of claim 1 further including applying a surface detection process to detect at least some of the dopant material on the top surface before and after the step of applying the surface treatment.

11. The method of claim 1 further including applying a surface detection process to detect at least some of the dopant material on the top surface after the step of applying the surface treatment.

12. A method of forming a doped Group IBIIIAVIA absorber layer for a solar cell on a base, the method comprising:

depositing a precursor layer on the base, the precursor layer comprising a Group IB material film, a Group IIIA material film, a Group VIA material film and a dopant material film;

annealing the precursor layer on the base to form the doped Group IBIIIAVIA absorber layer wherein the annealing of the precursor layer induces diffusion of the dopant to an exposed surface of the absorber layer;

interrupting the annealing of the precursor layer to remove at least some of the dopant from the exposed surface of the absorber layer, wherein the step of removing the dopant includes applying a liquid including water to remove at least some of the dopant, the liquid having a pH of 1 to 4; and annealing the precursor layer to continue to form the doped Group IBIIIAVIA absorber following removal of at least some of the dopant from the exposed surface.

13. The method of claim 12, wherein the precursor layer comprises comprising a Group IB material film including Cu, a Group IIIA material film including at least one of In and Ga, a Group VIA material film including Se and a dopant material film that includes at least one of Na, K and Li.

14. The method of claim 12, wherein the step of depositing the precursor layer comprises the steps of:

depositing a metallic stack including at least one Cu film, In film and Ga film;

depositing the dopant material film over the metallic stack; and depositing a first Se film on the dopant material film.

15. The method of claim 12, wherein the step of depositing the precursor layer further comprises the step of depositing a second Se film on the metallic stack prior to depositing the dopant material film.

16. The method of claim 12, wherein the step of annealing is performed at the first temperature range of 250-450° C.

17. The method of claim 12, wherein the step of annealing is performed at the second temperature range of 250-550° C.

* * * * *